(12) United States Patent
Lakkis

(10) Patent No.: US 7,683,724 B2
(45) Date of Patent: Mar. 23, 2010

(54) FREQUENCY SYNTHESIZER

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 11/950,274

(22) Filed: Dec. 4, 2007

(65) Prior Publication Data

US 2008/0136537 A1 Jun. 12, 2008

Related U.S. Application Data

(60) Provisional application No. 60/873,094, filed on Dec. 6, 2006.

(51) Int. Cl.
*H03B 5/02* (2006.01)
*H03B 27/00* (2006.01)
(52) U.S. Cl. .............................. 331/38; 331/57; 331/45
(58) Field of Classification Search .................. 331/38, 331/57, 45
See application file for complete search history.

(56) References Cited

U.S. PATENT DOCUMENTS 5,180,994 A * 1/1993 Martin et al. .................. 331/38

OTHER PUBLICATIONS

ECMA-368, "High Rate Ultra Wideband PHY and MAC Standard," ECMA International, Geneva, 1st Edition, Dec. 2005.
ECMA-369, "MAC-PHY Interface for ECMA-368," ECMA International, Geneva, 3rd Edition, Dec. 2008.
Lee, J., et al, "A 7-band 3-8 GHz frequency synthesizer with 1 ns band-switching time in 0.18 um CMOS technology," IEEE Int. Solid-State Circuits Conf. Tech. Dig., Feb. 2005, pp. 204-205.
Medi, A., et al, "A fully integrated multi-output CMOS frequency synthesizer for channelized receivers," Proc. IEEE Int. Systems-on-Chip Conf., Sep. 2003, pp. 75-78.
RAZAVI, B., et al, "A 0.13 um CMOS UWB transceiver," IEEE Int. Solid-State Circuits Conf. Tech. Dig., Feb. 2005, pp. 216-217.
Van De Beek, R., et al., "A fast-hopping single-PLL 3-band MB-OFDM UWB synthesizer," IEEE J. Solid-State Circuits, Jul. 2006, pp. 1522-1529.

* cited by examiner

*Primary Examiner*—Joseph Chang
(74) *Attorney, Agent, or Firm*—Dang M. Vo

(57) ABSTRACT

A voltage-controlled ring oscillator comprises a ring oscillator having a plurality of differential delay stages for generating signals having a common programmable oscillation frequency with different phases, and a pair of single-sideband mixers coupled to the differential delay stages for producing in-phase and quadrature phase signals having a frequency that is higher than the oscillation frequency.

16 Claims, 2 Drawing Sheets

FREQUENCY SYNTHESIZER

This application claims priority to Provisional U.S. Patent Application Ser. No. 60/873,094, filed Dec. 6, 2006.

BACKGROUND OF THE INVENTION

I. Field of the Invention

The present invention relates generally to frequency synthesizers, and particularly to voltage-controlled ring oscillators for high-speed communications.

II. Description of the Related Art

Ultra-wide band (UWB) systems offer exceptionally high throughput, which provides an attractive solution for very high data rate, short-range wireless networks used in personal computer and consumer electronic applications. The Federal Communications Commission (FCC) regulations for UWB communications specifies an operating range of 3.1-10.6-GHz frequency while employing at least 500 MHz of bandwidth (measured at 10-dB points) with a power spectral density (PSD) of less than 41.25 dBm/MHz.

In one aspect of the related art, the multiband orthogonal frequency-division multiplexing (MB-OFDM) specification for ECMA368-369 uses orthogonal frequency-division multiplexing (OFDM) modulation and specifies up to 14 bands, each with a bandwidth of 528 MHz and with center frequencies that range from 3432 MHz to 10296 MHz. The bands are grouped into six band groups, such as shown in FIG. 1.

There are several demanding requirements that make a frequency synthesizer for an MB-OFDM transceiver significantly different from well-known synthesizer designs used in narrow-band wireless systems. For example, it is difficult to implement a standard phase-locked loop (PLL)-based synthesizer for very high frequencies. Furthermore, since the range of frequencies spans several gigahertz, multiple frequency sources are typically employed, such as described in A. Medi and W. Namgoong, "A fully integrated multi-output CMOS frequency synthesizer for channelized receivers," in *Proc. IEEE Int. Systems-on-Chip Conf.*, September 2003, pp. 75-78, B. Razavi, T. Aytur, F.-R. Yang, R.-H. Yan, H.-C. Kang, C.-C. Hsu, and C.-C. Lee, "A 0.13 µm CMOS UWB transceiver," in *IEEE Int. Solid-State Circuits Conf. Tech. Dig.*, February 2005, pp. 216-217, R. van de Beek, D. Leenaerts, and G. van der Weide, "A fast-hopping single-PLL 3-band MB-OFDM UWB synthesizer," in *IEEE J. Solid-State Circuits*, July 2006, pp. 1522-1529, and J. Lee and D. Chiu, "A 7-band 3-8 GHz frequency synthesizer with 1 ns band-switching time in 0.18 µm CMOS technology," in *IEEE Int. Solid-State Circuits Conf. Tech. Dig.*, February 2005, pp. 204-205.

Therefore, there is a significant need in the art for a synthesizer that provides improved performance and reduces power consumption and enables a completely integrated MB-OFDM UWB transceiver.

SUMMARY OF THE INVENTION

Embodiments disclosed herein may be advantageous to systems employing MB-OFDM signals used in UWB systems, such as defined by the ECMA368-369 protocol. However, the invention is not intended to be limited to such systems, as other applications may benefit from similar advantages.

In one embodiment of the invention, a frequency synthesizer comprises a ring-oscillation means and a mixing means. The ring-oscillation means is configurable for generating a plurality of signals having an oscillation frequency and a plurality of signal phases. The ring-oscillation means may include, by way of example, but without limitation, a sequence of differential delay stages configured as a ring oscillator. The ring-oscillation means may be programmable (e.g., voltage-controlled) for producing an oscillating signal having a selectable (e.g., programmable) oscillation frequency.

The mixing means is coupled to the ring-oscillation means, and is configurable for multiplying the oscillation frequency by at least one predetermined multiplication factor to generate in-phase and quadrature-phase output signals having a higher frequency than the oscillation frequency. The mixing means may include, by way of example, but without limitation, a pair of single-sideband mixers coupled between delay stages of the ring-oscillation means. Since the multiplication factor multiplies the signal phase as well as the frequency, the number of delay stages and the coupling of the mixers between the stages are configured such that the signal phases input to the mixers are selected to produce the desired in-phase and quadrature-phase outputs.

Although particular embodiments are described herein, many variations and permutations of these embodiments fall within the scope and spirit of the invention. Although some benefits and advantages of the preferred embodiments are mentioned, the scope of the invention is not intended to be limited to particular benefits, uses, or objectives. Rather, embodiments of the invention are intended to be broadly applicable to different wireless technologies, system configurations, networks, and transmission protocols, some of which are illustrated by way of example in the figures and in the following description of the preferred embodiments. The detailed description and drawings are merely illustrative of the invention rather than limiting, the scope of the invention being defined by the appended claims and equivalents thereof.

BRIEF DESCRIPTION OF THE DRAWINGS

Embodiments according to the present invention are understood with reference to the following figures.

DESCRIPTION OF PREFERRED EMBODIMENTS

Figure 1:
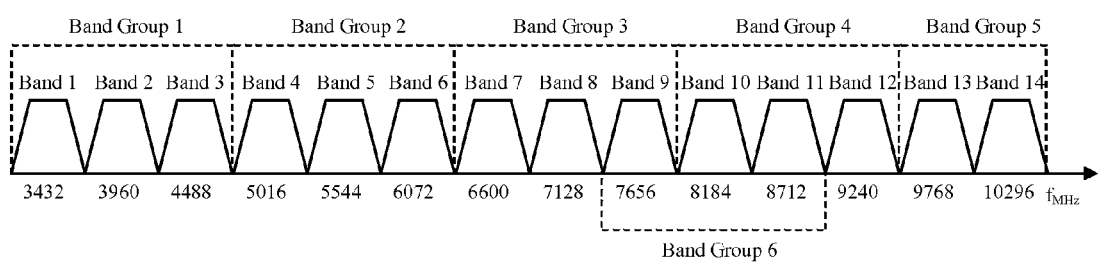
FIG. 1 is a spectrum diagram illustrating band groups described in the IEEE ECMA368-369 specification.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the spirit and scope of the invention as defined by the claims.

In accordance with one embodiment of the invention, a voltage-controlled ring oscillator that is configurable for generating in-phase and quadrature-phase signals employs single-sideband mixers to produce higher-frequency signals.

Figure 2:
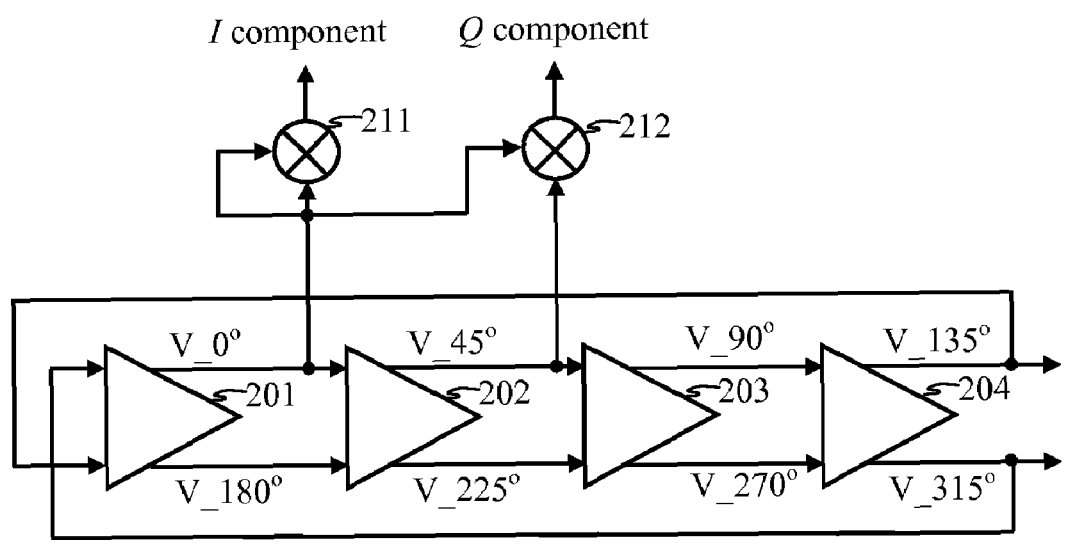
FIG. 2 is a block diagram of a voltage-controlled ring oscillator in accordance with an embodiment of the invention.

FIG. 2 is a block diagram of a voltage-controlled ring oscillator comprising four differential delay stages 201-204 and a pair of single-sideband mixers 211 and 212. Each of the differential delay stages 201-204 comprises an inverter with a pair of inputs and a pair of outputs. The stages 201-204 are connected sequentially such that the outputs of the first stage 201 are coupled to the inputs of the second stage 202. The outputs of the second stage 202 are coupled to the inputs of the third stage 203, and the outputs of the third stage 203 are coupled to the inputs of the fourth stage 204. The ring topology is provided by coupling the outputs of the last stage 204 of the sequence to the inputs of the first stage 201, such as shown in FIG. 2.

The phase relationship between each node is also shown in FIG. 2, and is indicated by the voltage $V\_M° = \cos(2\pi f t + M\pi/180)$, where M denotes phase (in degrees) and f is the oscillation frequency. In this case, the oscillator is configured to generate eight phases. However, alternative embodiments may be adapted to produce different numbers of phases by selecting a different number N of differential delay stages.

The oscillation frequency f of the ring oscillator is determined by the gate delay of the differential delay stages and the number of stages in the oscillator. For a feedback loop with N cascaded differential delay stages, the oscillation period of the ring is $2NT_d$, where $T_d$ is the delay of each stage, and the oscillation frequency is $f=1/(2T_d N)$. If the delay is voltage-controllable, then a variable-frequency output is generated. It is well known that the oscillation frequency may be tuned by varying any one of various parameters, including the loading capacitance (C), the loading resistance (R) and the transconductance (Gm).

Voltage-controlled ring oscillators typically generate an oscillation frequency f that ranges from a few hundred Megahertz to a few Gigahertz. However, ECMA368-369 specifies a frequency range of 3.1-10.6 GHz. Therefore, the single-sideband mixers 211 and 212 are employed for extending the upper end of the oscillator's frequency range.

The first single-sideband mixer 211 mixes the signal $V\_0°$ with itself to generate an in-phase (I) component at twice the oscillation frequency f. The second single-sideband mixer 212 mixes the signal $V\_0°$ with $V\_45°$ to generate the quadrature-phase (Q) component at twice the oscillation frequency f. Since the frequency f is doubled, the phase difference (45°) at f is doubled at 2f, making it a quadrature-phase signal relative to the I signal.

In one embodiment of the invention, a programmable ring oscillator is configurable for generating center frequencies for band groups 1, 3, and 6 (shown in FIG. 1) in accordance with the ECMA368-369 specification. These center frequencies are 3960 MHz, 7128 MHz, and 8712 MH. The oscillator portion comprising differential delay stages 201-204 is configurable for generating oscillation frequencies $f_1$, $f_2$, and $f_3$ of 3960 MHz, 3564 MHz, and 4356 MHz, respectively. The first oscillation frequency $f_1$ is the center frequency of the first band, thus outputs $V\_0°$ and $V\_90°$ may be selected as the I and Q components, respectively. The outputs $V\_0°$ and $V\_45°$ corresponding to the second oscillation frequency $f_2$ are processed by the single-sideband mixers 211 and 212 to generate the I and Q components with center frequency 7128 MHz. Similarly, the outputs $V\_0°$ and $V\_45°$ for the third oscillation frequency $f_3$ are processed by the single-sideband mixers 211 and 212 to produce the I and Q components with center frequency 8712 MHz.

The scope of the invention should not be interpreted as being limited to the numbers of and configurations of elements illustrated in the embodiments. Rather, the Applicant anticipates that alternative embodiments comprising different numbers of differential delay stages and/or single-sideband mixers may be implemented. Furthermore, different configurations of differential delay stages may be employed, and that such configurations fall within the scope and spirit of the invention. Similarly, different mixer configurations may be provided in accordance with various signal synthesis requirements dictated by alternative embodiments of the invention.

Some embodiments of the invention may provide for alternative multiplication factors (i.e., factors other than 2) of the signal frequency and phase produced by the ring oscillator portion comprising the differential delay stages. For example, embodiments of the invention may be configured to provide integer multipliers of three and/or four. Alternative embodiments may include dividers, such as to provide for fractional multipliers.

The embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention.

This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry and functional steps embodying principles of the invention.

Any element expressed herein as a means for performing a specified function is intended to encompass any way of performing that function including, for example, a combination of circuit elements which performs that function, or software in any form, including, therefore, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means that can provide those functionalities as equivalent to those shown herein.

The invention claimed is:

1. An oscillator, comprising:
  a ring oscillator comprising a plurality of delay stages configurable for generating a plurality of signals having at least a first signal frequency and a plurality of signal phases, and
  a plurality of mixers coupled to the plurality of delay stages configurable for multiplying the at least first signal frequency by at least one predetermined multiplication factor for producing in-phase and quadrature phase signals with at least a second signal frequency that is higher than the at least first signal frequency, wherein a first one of the mixers mixes a first one of the plurality of signals with itself to generate the in-phase phase signal and a second one of the mixers mixes the first one of the plurality of signals with a second one of the plurality of signals to generate the quadrature phase signal.

2. The oscillator recited in claim 1, wherein each of the plurality of delay stages comprises a differential inverter.

3. The oscillator recited in claim 1, wherein each of the plurality of mixers comprises a single-sideband mixer.

4. The oscillator recited in claim 1, wherein the ring oscillator is a programmable ring oscillator.

5. The oscillator recited in claim 1, configurable for generating a plurality of center frequencies in an Ultra-Wideband communication system.

6. An oscillation system, comprising:
a ring-oscillation means configurable for generating a plurality of signals having at least a first signal frequency and a plurality of signal phases, and
a mixing means coupled to the ring-oscillation means configurable for multiplying the at least first signal frequency by at least one predetermined multiplication factor for producing in-phase and quadrature phase signals with at least a second signal frequency that is higher than the at least first signal frequency, wherein the mixing means is configurable to mix a first one of the plurality of signals with itself to generate the in-phase phase signal and to mix the first one of the plurality of signals with a second one of the plurality of signals to generate the quadrature phase signal.

7. The oscillation system recited in claim 6, wherein the ring-oscillation means comprises a plurality of differential inverters.

8. The oscillation system recited in claim 6, wherein the mixing means comprises a plurality of single-sideband mixers.

9. The oscillation system recited in claim 6, wherein the ring-oscillation means is programmable for selecting the first signal frequency.

10. The oscillation system recited in claim 6, configurable for generating a plurality of center frequencies in an Ultra-Wideband communication system.

11. A method, comprising:
generating a plurality of signals having at least a first signal frequency and a plurality of signal phases, and
producing in-phase and quadrature phase signals with at least a second signal frequency that is higher than the at least first signal frequency by mixing a first one of the plurality of signals with itself to generate the in-phase phase signal and mixing the first one of the plurality of signals with a second one of the plurality of signals to generate the quadrature phase signal.

12. The method of claim 11, wherein generating the plurality of signals having at least the first signal frequency and a plurality of signal phases comprises utilizing a plurality of delay stages each comprising a differential inverter.

13. The method of claim 11, wherein:
mixing the first one of the plurality of signals with itself comprises utilizing a first single-sideband mixer; and
mixing the first one of the plurality of signals with the second one of the plurality of signals comprises utilizing a second single-sideband mixer;
to generate the in-phase phase signal and mixing the first one of the plurality of signals with a second one of the plurality of signals to generate the quadrature phase signal each of the plurality of mixers comprises a single-sideband mixer.

14. The method of claim 11, wherein a value of the second signal frequency is programmable.

15. The method of claim 11, wherein a value of the second signal frequency is programmable to produce one of a plurality of center frequencies in an Ultra-Wideband communication system.

16. A computer readable medium encoded with instructions executable to cause an apparatus to:
generate a plurality of signals having at least a first signal frequency and a plurality of signal phases, and produce in-phase and quadrature phase signals with at least a second signal frequency that is higher than the at least first signal frequency by mixing a first one of the plurality of signals with itself to generate the in-phase phase signal and mixing the first one of the plurality of signals with a second one of the plurality of signals to generate the quadrature phase signal.

* * * * *